United States Patent [19]
Devigne et al.

[11] Patent Number: 5,158,660
[45] Date of Patent: Oct. 27, 1992

[54] ROTARY SPUTTERING CATHODE

[75] Inventors: Roland Devigne, Falisolle; Jean-Pierre Beaufays, Jemeppe S/Sambre, both of Belgium

[73] Assignee: Saint-Gobain Vitrage International, Courbevoie, France

[21] Appl. No.: 712,662

[22] Filed: Jun. 10, 1991

[30] Foreign Application Priority Data

Jun. 8, 1990 [BE] Belgium .................... 90 00577

[51] Int. Cl.⁵ .......................................... C23C 14/34
[52] U.S. Cl. ...................... 204/298.21; 204/192.12; 204/298.09; 204/298.26; 204/298.28
[58] Field of Search ............... 204/298.09, 298.11, 204/298.12, 298.18, 298.21, 298.22, 298.23, 298.26, 298.28, 192.12

[56] References Cited

U.S. PATENT DOCUMENTS 4,443,318  4/1984  McKelvey ............... 204/298.21 X
4,445,997  5/1984  McKelvey ............... 204/298.21 X
5,047,131  9/1991  Wolfe et al. ............. 204/298.22 X

FOREIGN PATENT DOCUMENTS 3229969  4/1983  Fed. Rep. of Germany ................ 204/298.22

OTHER PUBLICATIONS

Wright et al., "Design . . . Magnetron", J. Vac. Sci. Technol May–Jun 4, 1986, No. 3.

Primary Examiner—Nam Nguyen
Attorney, Agent, or Firm—Oblon, Spivak, McClelland, Maier & Neustadt

[57] ABSTRACT

A vacuum sputtering cathode has a hollow structure (2) able to rotate about its axis and a magnetic confinement circuit (3) arranged peripherally about said structure. The cathode according to the invention is particularly suitable for the rapid dissipation of the thermal energy given off by the sputtering process and in particular for the sputtering of metals with a low melting point.

13 Claims, 4 Drawing Sheets

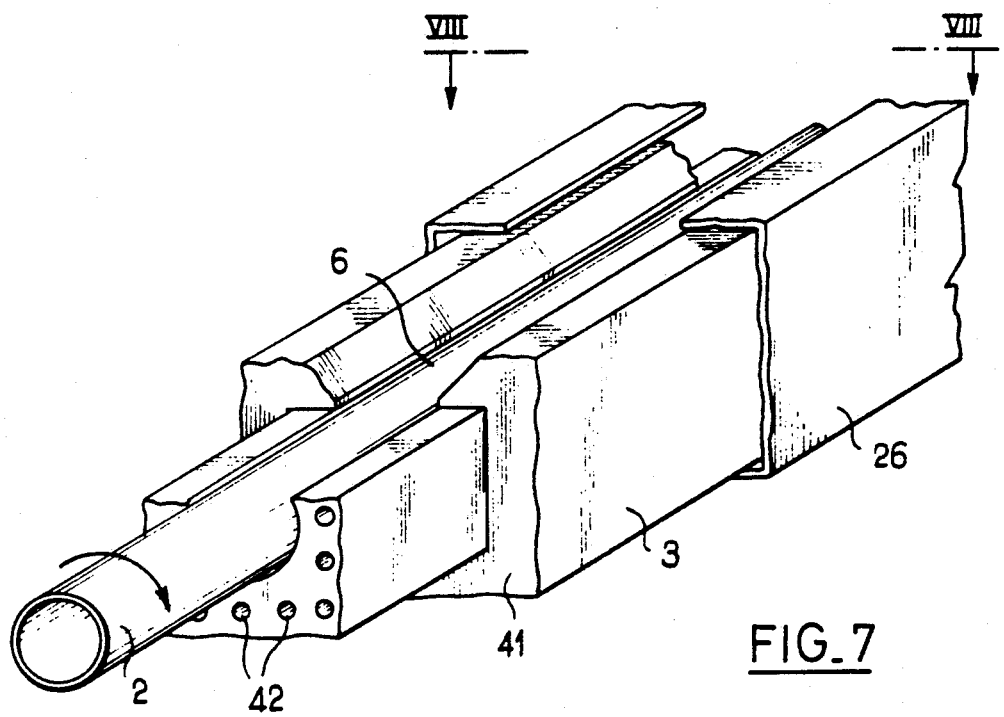
FIG_7
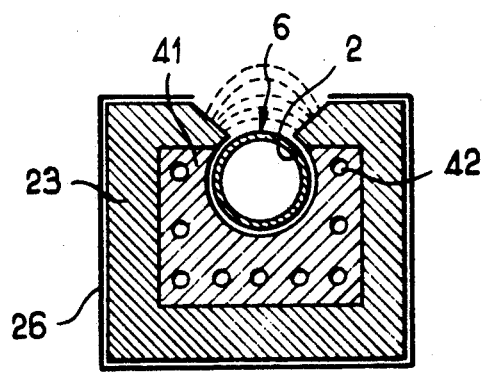
FIG_8

ROTARY SPUTTERING CATHODE

BACKGROUND OF THE INVENTION

1. Field of the Invention

The invention relates to a sputtering cathode with a rotary target.

2. Description of the Related Art

Cathodic sputtering is a well known process for the application of thin, uniform films of a coating material to various substrates.

Cathodic sputtering, which is more particularly described in U.S. Pat. No. 2,146,025, is carried out by means of a cathode connected to an electric power supply and placed in a vacuum enclosure, into which are injected traces of gases (e.g. argon). A target made from the material to be sputtered is mounted on the cathode and is bombarded with high-energy ions produced by the meeting of the gas molecules dispersed in the enclosure and electrons accelerated by the electrical field and magnetically confined close to the target.

The gaseous ions with a high kinetic energy are precipitated on the target with an adequate energy to remove particles therefrom. These particles are condensed on the substrate to be coated, which is positioned in their path and thus a fine coating of material is deposited thereon. This coating can consist of a metal or an alloy and reference is then made to a metal sputtering procedure.

It is also possible to deposit a substance formed by chemical reaction between the target material and a reactive gas introduced in small quantities into the sputtering chamber and reference is then made to reactive mode sputtering.

The rotary cathode according to the invention can advantageously be used with both the metal and reactive sputtering methods, but it is particularly suitable for use in the reactive mode.

The efficiency of vacuum sputtering or atomization equipment was initially very poor, due to the limited probability of ions and electrons meeting in the enclosure. By confining the electrons in the vicinity of the target, there is a significant increase in the ionization level and it is possible to work at a lower pressure, thus increasing the purity of the deposits.

U.S. Pat. No. 4,166,018 describes a planar target cathode behind which are arranged magnets in such a way as to form a confinement zone which is closed on itself in the manner of a oval track and in which the electrons are trapped. This leads to a significant increase in the collision rate with the gaseous atoms, i.e. impacts of ions on the cathode, so that the sputtering rate rises.

In such a cathode, the target undergoes local groove-like erosion, which follows the magnetic track. This makes it necessary to frequently replace the target and the usage rate of the target material is low.

Different processes have been used in order to better distribute the erosion over the extent of the target. Thus, in U.S. Pat. No. 4,525,264, a variable magnetic field is superimposed on that of the magnetic confinement circuit positioned behind the target.

U.S. Pat. No. 4,422,916 describes a cathode having a target mounted on a structure in the form of a rotary cylinder, magnetic confinement means being arranged along a generatrix within the cylindrical structure. Wear to the target is rendered uniform by the angular displacement of the erosion zone. As the confinement means are arranged within the cylindrical structure, the latter must necessarily have large dimensions. As said structure is also filled with a cooling fluid, due to its own weight it is subject to high mechanical stresses. Therefore the usage rate of the target cannot generally exceed 40%.

Moreover, the magnets and the parts of the magnetic circuit, confined in the internal volume of the cylindrical structure, form an obstacle to the circulation of the cooling fluid, mainly in the area where target heating takes place. Therefore the cooling is not very satisfactory, specifically at the point where it must be very efficient. In addition, as the magnets and the magnetic pieces are constantly immersed in this cooling fluid, which is normally water, necessarily corrosion problems occur.

SUMMARY OF THE INVENTION

The object of the present invention is a cathode in which there is a high target usage rate.

Another object of the invention is for the target to undergo a more uniform erosion over its surface.

Another object of the invention is to obtain a cathode in which the target is relatively inexpensive to manufacture and is also easy to replace.

The invention also has as an object a cathode in which the dissipation of the thermal energy produced by the sputtering process is improved compared with known systems.

Yet another object is for the cathode to be able to function at a lower temperature by limiting target heating.

The invention is directed at a vacuum sputtering cathode having a hollow structure and substantially in the form of a body of revolution, which can rotate about its own axis. This hollow structure comprises a side wall extending peripherally in accordance with the axis, as well as two end faces substantially perpendicular to the axis. The hollow structure is constituted, at least externally of its side wall, from the material to be sputtered. The cathode also has a fixed magnetic confinement circuit located in the vicinity of a target, said circuit comprises pole pieces, parts made from a magnetically permeable metal and magnetic means able to produce a magnetic flux in said circuit. Means are also provided for a connection to an electric supply circuit and for rotating the hollow structure about its axis. In the cathode, the magnetic circuit extends peripherally with respect to the hollow structure, the magnetic means being positioned externally thereof. The pole pieces of the magnetic circuit are arranged in accordance with two generating lines of said hollow structure, the arc of the side wall of the hollow structure between said two generating lines forming the cathode target.

According to an advantageous embodiment, the hollow structure, substantially in the form of a body of revolution, in a cylinder.

According to an advantageous embodiment, the outer lateral surface of the rotary hollow structure is constituted by a solid layer of material to be sputtered.

According to another embodiment, the rotary hollow structure has an appropriately shaped support covered with the material to be sputtered.

Advantageously, the means for connecting to a cooling circuit are located on the same end face of the hollow structure. In a preferred manner, the means for connecting to the cooling circuit are coaxial.

In an advantageous version of the cathode, the parts of the magnetic circuit also have means for connecting to a cooling circuit separate from that of the hollow structure.

According to a special embodiment, the pole pieces have wedge-shaped ends, the edges of said pole piece ends being directed substantially towards the edge of the target. The faces of the pole pieces turned towards the substantially planar air gap form with the surface of the target an angle of 90°, so that the force lines of the magnetic field extend between the said pole pieces in accordance with a curvature close to that of the target and in the immediate vicinity of the latter.

According to an advantageous embodiment, the cathode has two juxtaposed hollow structures, their axes being parallel and their respective magnetic circuits having at least one common part.

In a variant of this embodiment, the pole pieces of the magnetic Circuits of each hollow structure are both located on the same side of the cathode, so that the corresponding targets are able to atomize or sputter in the same angular direction. One pole piece extends between the two hollow structures and forms a common part for the two magnetic circuits, a common pole piece being carried by said common branch.

According to another variant of this embodiment, the pole pieces of the two cathodes are arranged on two opposite faces of the cathode. The targets corresponding to each hollow structure are arranged in diametrically opposite manner with respect to one another and are able to sputter or atomize in two parallel planes. The magnetic circuits extend peripherally to each of the targets and have a common central part extending between the targets.

According to an advantageous embodiment, the hollow rotary structure is surrounded, with the exclusion of the arc forming the target, by a sheath traversed by a cryogenic fluid able to bring about a radiative heat exchange with the target surface.

According to a different embodiment of the cathode according to the invention, the magnetic circuit forms two loops, which close in a symmetrical manner, the magnetic means, the pole pieces and most of the magnetic circuit being positioned externally of the hollow structure on either side thereof. The magnetic poles of each loop are positioned in accordance with two generating lines of said structure, defining diametrically opposite angular segments on the side wall of said structure. These angular segments constitute two targets able to sputter the material in two opposite directions. The parts of the magnetic circuit arranged on either side of the exterior of the rotary hollow structure are magnetically connected by a soft iron bridging core arranged in non-rotary manner within the rotary hollow structure, in accordance with the transverse plane having the cathode axis, each end of said bridging means facing, beyond the side wall of the hallow structure, an extension of the parts of the magnetic circuit located outside the structure.

Apart from achieving the aims referred to hereinbefore, the cathode according to the invention more particularly has the following advantages:

It makes it possible to sputter metals or alloys having a low melting point without any risk of the target melting.

The particular configuration of the target makes it possible to utilize novel, advantageous production methods (charge by sputtering, casting, electrolysis, etc).

The pole pieces, which are largely made from iron, are covered or can be previously covered with a metal film sputtered by the target and are not involved in the composition of the coating sputtered on the substrate.

The shape of the pole pieces can easily be modified as a function of the desired confinement criteria.

It is possible to join the cathodes according to the invention and in this way obtain an increased overall sputtering efficiency per volume unit or length unit of the deposition installation.

In view of the very considerable rigidity of the target, it is possible to place the cathode according to the invention in various positions, including an inclined position, and even in an overhanging position, without prejudicing its operation or the manufacturing tolerances.

BRIEF DESCRIPTION OF THE DRAWINGS

Other features and advantages of the cathode according to the invention can be gathered from the following description of an embodiment with reference to the attached drawings, wherein:

FIG. 7 is a perspective view of a cathode having a cryogenic sheath; and

FIG. 8 is a sectional view along plane VIII—VIII of the cathode of FIG. 7.

DETAILED DESCRIPTION OF THE PREFERRED EMBODIMENTS

Figure 1:
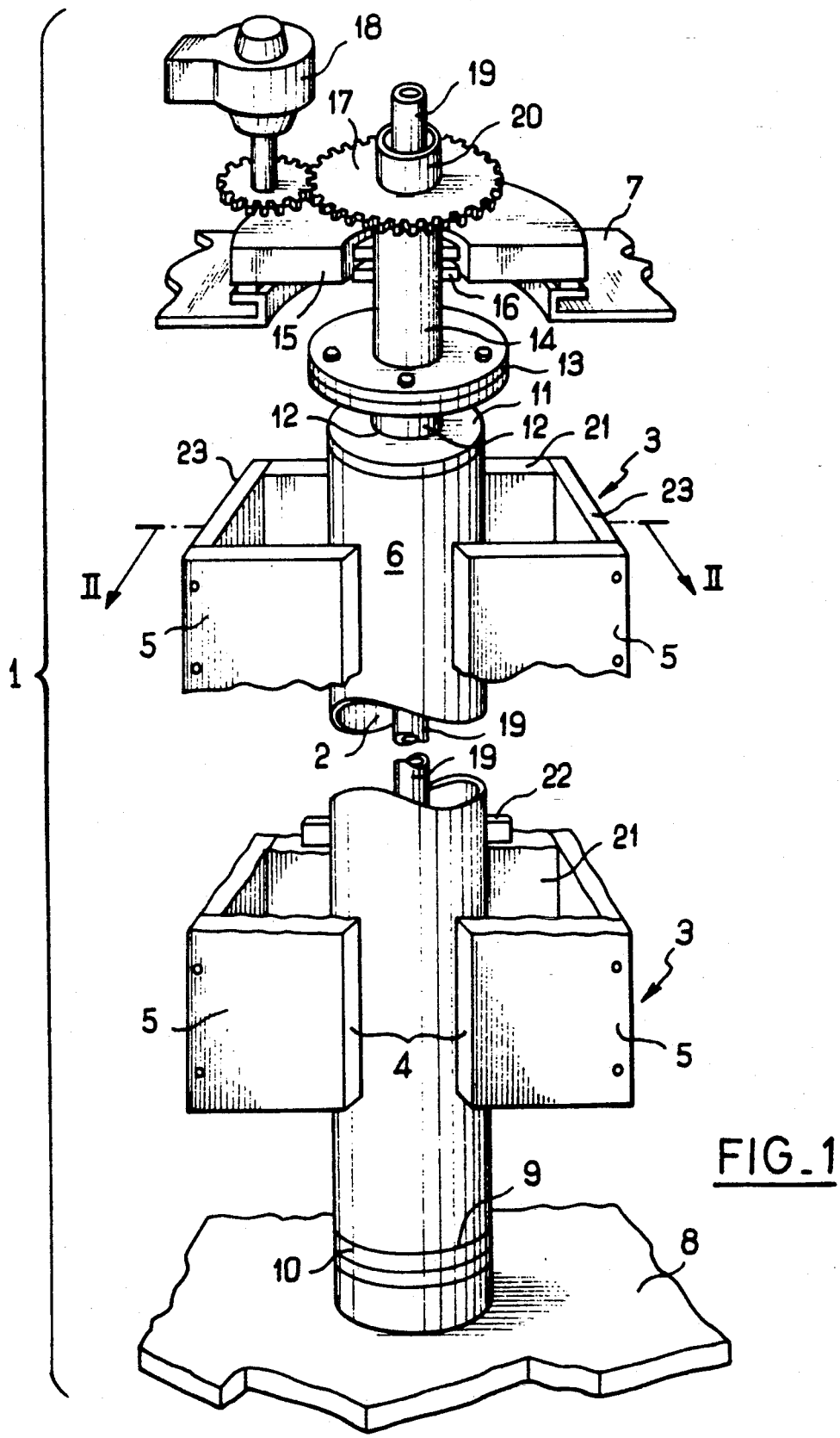
FIG. 1 is a perspective view, partly broken away, of a rotary cathode according to the invention.

FIG. 1 shows in perspective and in interrupted form, a cathode according to the invention with its driving system and a broken away view of its enclosure.

The central part of the cathode 1 is a hollow, elongated structure 2, shown here with a vertical axis, In this case the hollow structure 2 is cylindrical but, without going beyond the scope of the invention, it could be non-circular. The hollow structure 2 is surrounded by a magnetic confinement circuit 3, which therefore extends entirely externally of the structure 2.

The only interruption of the magnetic circuit is the air gap 4, which extends between the pole pieces 5 arranged along the axis of the hollow structure 2 from the top to the bottom of said structure. The lateral surface of the hollow structure 2 is made from the metal to be sputtered. The lateral surface portion of the hollow structure positioned facing the air gap 4 separating the pole pieces 5 forms the "target" 6 of the cathode 1.

The cathode 1 is shown as vertically installed within a vacuum chamber, the upper wall 7 and lower wall 8 of said chamber being only partially shown, the air gap 4 being parallel to the (not shown) substrate travel plane.

The magnetic confinement circuit 3 of the cathode 1 according to the invention is fixed in the vacuum chamber 7,8 by known fixing means and independently of the hollow rotary structure 2.

One of the end faces 9 of the hollow structure 2 is fixed to the floor 8 by means of a roller plate 10, which enables it to rotate about its own axis and isolates it from the enclosure 7,8. The other end face 11 has a neck 12 to which is fixed a flange 13 by which the hollow rotary structure 2 is integral with a hollow driving shaft 14. The latter extends through a rotary passage 15 made in the upper wall 7 of the enclosure 7,8. Insulating means 16 electrically insulate the body of the passage 15 and the shaft 14.

Gears 17 for transmitting a rotary torque are installed between the driving shaft 14 and the driving motor 18 for rotating the hollow rotary structure 2. The driving shaft 14 and the axis of the hollow rotary structure 2 are traversed lengthwise by pipes 19,20 (arranged coaxially in FIG. 1) which communicate with the internal volume of the hollow structure 2. One of the pipes 19, 20 introduces cooling fluid while the other withdraws the cooling fluid.

Figure 2:
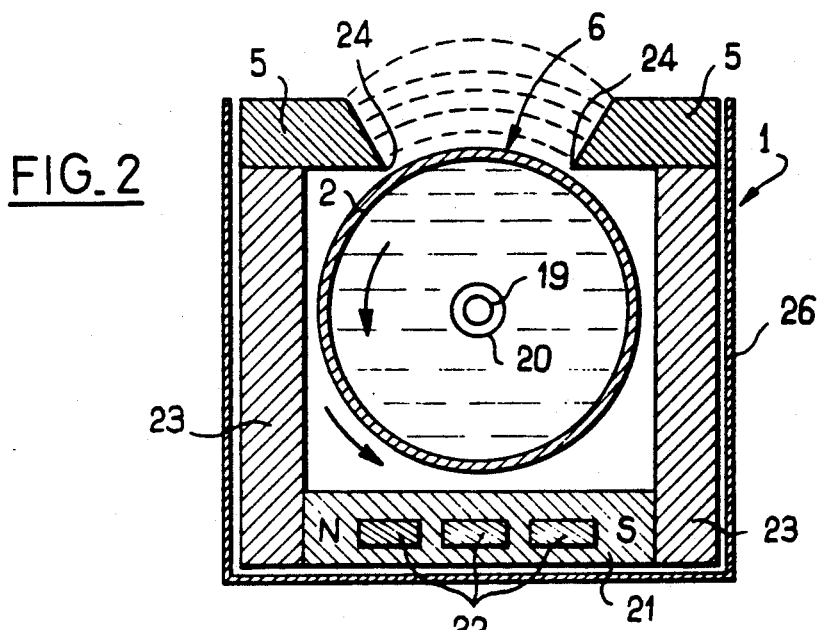
FIG. 2 is a section of the cathode of FIG. 1 along a plane perpendicular to the longitudinal axis of the cathode.

As can be seen in FIG. 2, it is thus possible to pass into the structure 2, during the operation thereof, a considerable cooling fluid flow. This fluid is advantageously water. The cooling fluid flow does not encounter any obstacle within the structure 2, which permits a particularly vigorous cooling, which cannot be obtained with conventional cathode types with an equivalent power level.

The liquid inlet and outlet, as well as the driving system 17,18 are located at the same end face 11 of the hollow structure 2, so that maintenance, recharging or replacement of the hollow structure 2 is particularly easy.

The hollow structure 2 of the cathode according to the invention can thus be extracted without it being necessary to at the same time dismantle its magnetic confinement circuit 3.

In addition, the dimensions, and in particular the diameter, of the structure 2 are not limited by the need to leave sufficient space below the structure 2 for the magnets and other magnetic parts located in the interior (as is conventional). Therefore the cathode 1 can be constructed so as to give preference to any one of its dimensional characteristics as a function of the sought aim.

Therefore the hollow structure 2 of the cathode according to the invention can be in the form of relatively small diameter bars, as well as large diameter cylinders for working with metals with a low melting point.

By an accompanying modification of the shape of the pole pieces, it is also possible to use a hollow structure 2 in the form of a volume of revolution, whose generatrix is not straight and is instead a curved line adapted to the shape of non-planar substrates.

The manufacture of such rotary hollow structures 2 can be done by using conventional methods, or alternatives thereto which can be of economic interest, such as investment casting, plasma atomization, sputtering and other known procedures.

For certain applications, the roller plate 10 shown in FIG. 1 can also be mounted on the same side as the rotary passage 15, which facilitates dismantling and makes it possible to work in an overhanging manner, e.g. for reduced width atomization or sputtering, which increases the flexibility of production of certain sputtering lines.

FIG. 2 shows the cathode 1 in section along a plane perpendicular to its axis. The internal cavity of the hollow structure 2 in here entirely filled with a cooling fluid (water in this case) permanently supplied by the central pipe 19. This water rises in the structure 2, while cooling the walls and the back of the "target" zone 6 and without meeting any obstacle, and is then discharged coaxially by the pipe 20, e.g., by holes in the latter.

The magnetic confinement circuit 3 is located entirely outside the volume of the hollow structure 2 and almost completely surrounds it up to the pole pieces 5.

The magnetic confinement circuit 3 is constituted by a central bar 21 on which are mounted permanent magnets 22 (which could also be electromagnets).

At the end of the central bar 21 are fitted two legs of the circuit 23 carrying the pole pieces 5 oriented towards one another and between which extends the air gap.

These pole pieces 5 have ends shaped like a wedge. The tip 24 of the wedge is directed towards the target 6. The faces of the pole pieces 5 directed towards the air gap 4 are substantially planar and extend in a radial plane passing through the center of the structure 2.

This configuration gives the magnetic lines of force (shown as dash lines), a curvature substantially parallel to that of the target 6 and a uniform distribution, which is advantageous for a wide distribution of the erosion zone of the target 6. A shielding electrode 26 is fitted in the immediate vicinity of the cathode 1 and is grounded.

Figure 3:
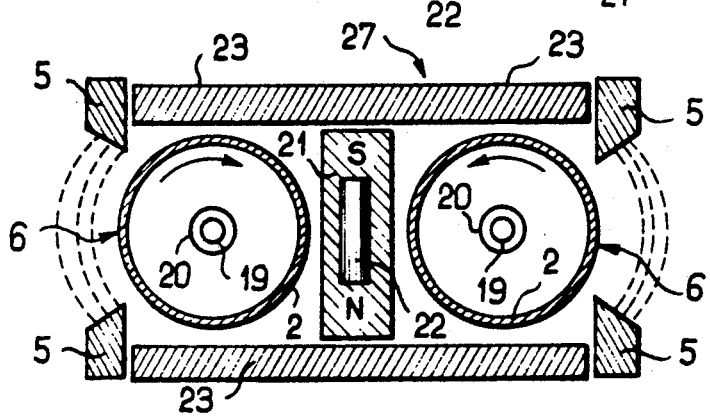
FIG. 3 is a schematic sectional view along a plane perpendicular to the axis of a cathode with a double rotary structure and two parallel sputtering planes.

FIG. 3 shows another cathode 27 according to the invention having a double projection plane. The cathode 27 has two cylindrical hollow structures 2 arranged parallel to the longitudinal axis of the cathode 27.

The two rotary structures 2 are separated by a common magnetic bar 21 of the magnetic circuit 3, and in which are inserted magnetic means 22, in the present case permanent magnets. Two magnetic branches 23 extend in opposition to one another from each end of the common bar 21 and substantially perpendicular to the latter. The resulting H-shaped assembly surrounds the two hollow structures 2.

Pole pieces 5 are mounted at the free end of each magnetic branch 23, pointing in the direction of the corresponding hollow structure 2 in such a way that the magnetic flux produced by the magnets 22 is symmetrically closed within the air gaps corresponding to the two targets 6 of the cathode 27.

The cathode 27 has the advantage of being able to simultaneously atomize in two planes and of having reduced overall dimensions compared with two separate cathodes having equivalent performance characteristics.

Figure 4:
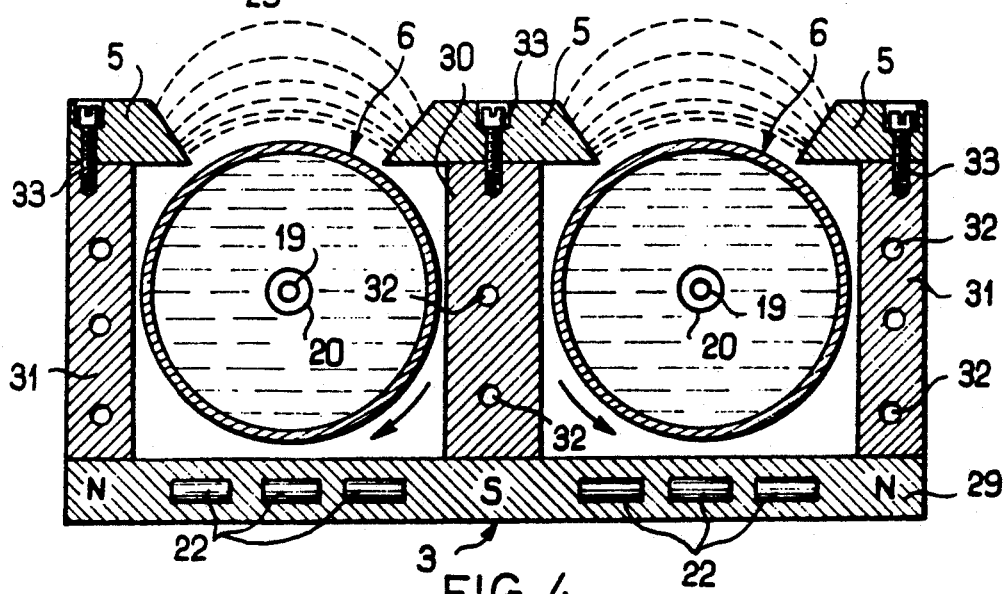
FIG. 4 is a schematic sectional view along a plane perpendicular to the axis of a cathode having a double rotary structure and to a sputtering plane.

FIG. 4 shows another variant of the cathode according to the invention, in which two rotary structures 2 are juxtaposed in a common magnetic plane and project into the same plane.

The magnetic circuit 3 here has the overall shape of a capital letter E. Magnetic means 22 are arranged in the common bar 29, which represents the stem of the E and are symmetrical with respect to the central branch 30 running between the two hollow rotary structures 2 of the cathode 28. The fluxes produced by the magnetic means 22 respectively pass through the extreme branches of the circuit into the pole pieces 5 fixed to the branches 31, traverse the air gap above each target 6 and return to the magnetic means 22 by the common central branch 30, which has a larger cross-section in order to prevent saturation.

The magnetic field force lines are inflected by the shape of the pole pieces 5 and substantially follow the curvature of the targets 2.

Channels 32 completely traverse the parts of the magnetic circuit 3. During the operation of the cathode, said channels 32 are traversed by a cooling fluid from a circuit separate from that used for the hollow structure 2, so that the temperature of the magnetic circuit 3 can be controlled independently compared with that of the hollow structures 2 and the target 6.

As in the constructions shown in FIGS. 1 and 2, the hollow structures 2 of the cathode 28 are traversed lengthwise by water circulated by central coaxial pipes 19,20.

Fixing devices 33 join the pole pieces 5 to the magnetic branches 30,31. If appropriate, these pole pieces 5 can easily be replaced for adoption of a new target or substrate profile.

Figure 5:
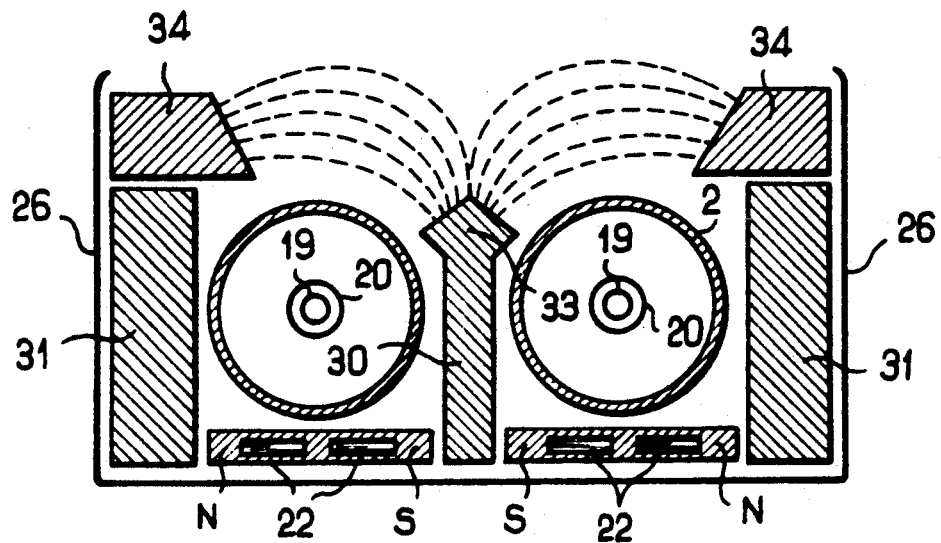
FIG. 5 is a section along a plane perpendicular to the axis of a cathode identical to that of FIG. 4 and having asymmetrical pole pieces.

FIG. 5 shows a constructional variant of a cathode according to the invention of the same type as that in FIG. 4 but having asymmetrical pole pieces 34,35.

Seen in profile, the magnetic circuit 3 has the general appearance of a capital letter E, the pole pieces 34,35 being located at the end of each branch, the branches 31,32 surrounding the two hollow structures 2. The outer pole pieces 34 and the branches 31 supporting the same are over-dimensioned compared with the common central branch 30 and its pole piece 35. This magnetic circuit configuration tends to deform the configuration of the force lines in the two air gaps 4. Thus, in a controlled manner, it is possible to permit the escape of a certain quantity of electrons confined in the air gap.

Figure 6:
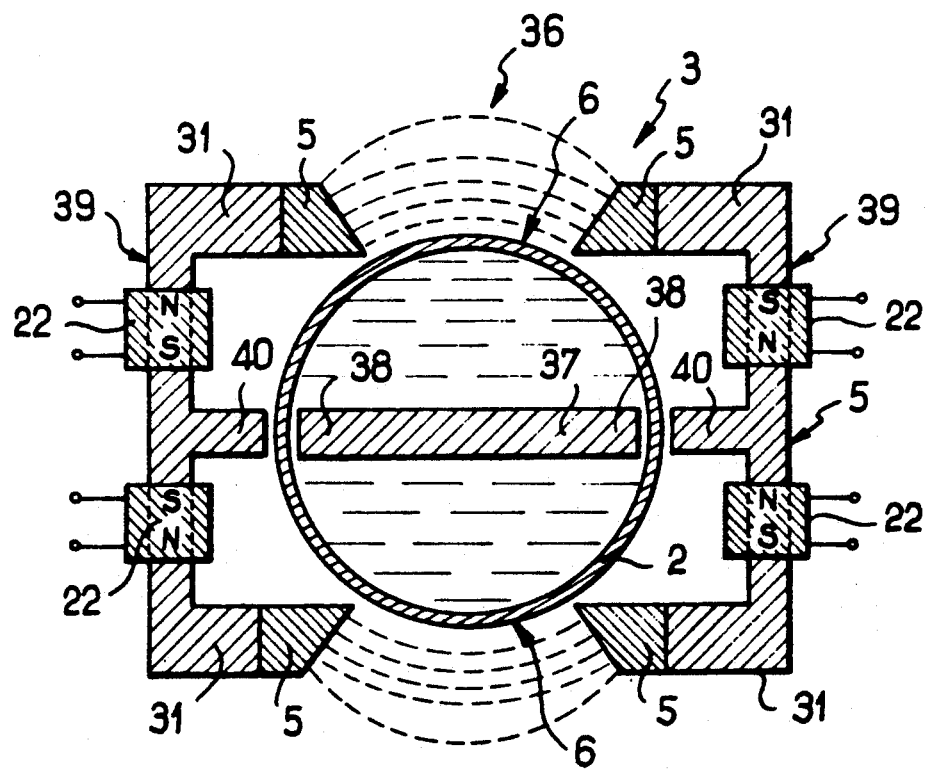
FIG. 6 is a diagrammatic sectional view along a plane perpendicular to the axis of a cathode according to the invention and having a double projection plane.

FIG. 6 shows an advantageous shape 36 of a rotary cathode according to the invention having a single hollow structure 2 and with a double sputtering plane. This cathode 36 has a hollow cylindrical structure 2 positioned centrally. A soft iron bridging member 37 having a rectangular cross-section horizontally subdivides in the diametral plane the internal volume 3 of the hollow structure 2.

The ends 38 of said bridging member 37, kept stationary with respect to the cathode 36, almost touch the inner face of the relatively rotating hollow structure 2. On either side of the structure 2 are symmetrically arranged two portions 39 of elements forming the overall magnetic circuit 3. These portions 39 are respectively shaped like a capital E and an inverted capital E. The median branches 40 of the portion 39 are aligned across the hollow structure 2, facing the ends 38 of the bridging part 37. The external branches 31 of each portion of the circuit 39 (corresponding to the external branches of the E's) carry the pole pieces 5. The points or tips of these pole pieces define, on either side of the hollow rotary structure 2, two cylindrical arcs which are angularly displaced by 180° and which constitute the two targets 6 of the cathode 36.

On the two E-shaped portions 39 of the magnetic circuit, the stems have magnetic means 22 (in this case electromagnets) arranged in opposition, so as to bring about a circulation of two identical magnetic fluxes in parallel in the air gaps. For closing the circuit, said fluxes have a common part, namely the bridging member 37. The presence of part 37 in no way reduces the heat dissipation in the hollow structure 2 and there is a considerable space gain compared with the use of two separate cathodes with equivalent performance characteristics.

Due to the presence of the bridging member 37, water circulation can be had by pipes (not shown) in each of the chambers defined by the bridging member.

FIGS. 7 and 8 show in section and in broken away form, another sputtering cathode according to the invention, whose hollow structure 2 is surrounded, with the exception of the cylindrical arc forming the target 6, by a sheath 41 traversed by channels 42 in which circulates a cryogenic fluid (such as liquid helium, nitrogen or freon). This sheath 41 is made from a non-magnetic material and is designed so as to dissipate, by a radiative effect, a maximum amount of heat from the surface of the hollow structure 2. As shown in FIGS. 7 and 8, said sheath 41 can almost entirely fill the volume between the external magnetic circuit 3 and the hollow rotary structure 2, or can be formed by a curved plate traversed by channels 42 (or to which are joined channels) arranged at a limited distance from the surface of the hollow structure 2, with the exception of the target.

The reduction of the temperature on the surface of the hollow structure 2, together with the vigorous cooling obtained with the cathode, makes it possible to even atomize without difficulty metals having a low melting point.

Obviously, numerous modifications and variations of the present invention are possible in light of the above teachings. It is therefore to be understood that with in the scope of the appended claims, the invention may be practiced otherwise than as specifically described herein.

What is claimed as new and desired to be secured by Letters Patent of the United States is:

1. Vacuum sputtering cathode comprising:
 a rotatably mounted structure substantially in the form of a body of revolution, said structure having a side wall extending parallel to the axis of the body of revolution and two end faces substantially perpendicular to the axis to form a hollow structure, said structure being formed, at least at the exterior of the side wall, of the material to be sputtered;
 a fixed magnetic confinement circuit located in the vicinity of said side wall and external to said hollow structure, said circuit comprising branch parts made from magnetically permeable metal pole pieces mounted on said branch parts and magnetic means for producing a magnetic flux in said circuit;
 means connectable to a cooling circuit for circulating a cooling fluid in the hollow structure; and
 driving means for rotating the hollow structure about the axis,
 wherein said pole pieces face one another in pairs to form at least one air gap adjacent an arc of said side wall, said arc comprising a cathode target.

2. Cathode according to claim 1, wherein the hollow structure comprises a cylinder.

3. Cathode according to claim 1, wherein the external surface of the side wall comprises a solid layer of material to be sputtered.

4. Cathode according to claim 1 wherein the hollow structure comprises an internal support covered with the material to be sputtered.

5. Cathode according to claim 1, wherein the means connectable to a cooling circuit comprise pipes extending from the same end face of the hollow structure.

6. Cathode according to claim 5, wherein the pipes are coaxial.

7. Cathode according to claim 1, including a cooling circuit for the magnetic circuit.

8. Cathode according to claim 1, wherein said pole pieces have wedge-shaped ends, a tip of each said pole piece being directed substantially towards the target, each said pole piece having a face turned towards the air gap, which face is substantially planar and forms with the surface of the target an angle of substantially 90°, such that the magnetic field force lines extending between pairs of said pole pieces have a curvature close to that of a corresponding target.

9. Cathode according to claim 1, including two juxtaposed ones of said hollow structures, the axis of said structures being parallel, the magnetic confinement circuit having at least one part common to both of said structures.

10. Cathode according to claim 9, wherein the pole pieces are all located on the same side of the cathode so as to sputter in the same direction, a branch extending between the two hollow structures forming the common part, a common pole piece common to both of said structures being carried by said common part.

11. Cathode according to claim 9, wherein the pole pieces comprise at least two pairs of pole pieces located on two opposite faces of the cathode, the targets corresponding to each of the hollow structures being positioned diametrically opposite to one another, so as to sputter in two parallel planes, the common part extending between said structures.

12. Cathode according to claim 1, wherein the hollow structure is surrounded, with the exception of the arc forming the target, by a sheath traversed by a cryogenic fluid, for causing a radiative heat exchange with the lateral surface of the target.

13. Cathode of claim 1 wherein the magnetic confinement circuit forms two symmetrical loops, the magnetic means and the pole pieces being positioned externally of said hollow structure, said pole pieces defining two targets positioned to sputter material in two opposite directions, said two symetrical loops being magnetically connected by a soft iron bridging core positioned in non-rotary manner within said hollow structure, each end of said bridging core facing, via the side wall of the hollow structure, an extension of an external portion of the magnetic confinement circuit.

* * * * *